(12) United States Patent
Oe (10) Patent No.: US 12,411,394 B2
(45) Date of Patent: Sep. 9, 2025

(54) IMAGE CAPTURING APPARATUS

(71) Applicant: CANON KABUSHIKI KAISHA, Tokyo (JP)

(72) Inventor: Yusaku Oe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 177 days.

(21) Appl. No.: 18/339,100

(22) Filed: Jun. 21, 2023

(65) Prior Publication Data

US 2023/0418135 A1    Dec. 28, 2023

(30) Foreign Application Priority Data

Jun. 24, 2022    (JP) ................................ 2022-102256

(51) Int. Cl.
  *G03B 17/55*    (2021.01)
  *H04N 23/52*    (2023.01)
  *H05K 7/20*    (2006.01)

(52) U.S. Cl.
  CPC ............. *G03B 17/55* (2013.01); *H04N 23/52* (2023.01); *H05K 7/20145* (2013.01); *H05K 7/2039* (2013.01)

(58) Field of Classification Search
  CPC ........ H04N 23/51; H04N 23/52; G03B 17/55; H05K 1/0201; H05K 1/0203; H05K 7/20145; H05K 7/2039
  See application file for complete search history.

(56) References Cited

U.S. PATENT DOCUMENTS

| | | | |
|---|---|---|---|
| 2016/0301819 A1 | 10/2016 | Petty | |
| 2017/0261840 A1* | 9/2017 | Yoneda | H04N 23/51 |
| 2021/0232024 A1* | 7/2021 | Endo | H04N 23/54 |
| 2021/0289110 A1* | 9/2021 | Ogawa | H05K 1/021 |
| 2021/0373417 A1 | 12/2021 | Iritani | |
| 2022/0286585 A1* | 9/2022 | Amano | H04N 23/51 |
| 2023/0035644 A1* | 2/2023 | Kuroki | H05K 7/2039 |
| 2024/0074030 A1* | 2/2024 | Tomimoto | H04N 23/52 |

FOREIGN PATENT DOCUMENTS

| | | |
|---|---|---|
| JP | 2009071722 A | 4/2009 |
| JP | 2010130571 A | 6/2010 |
| JP | 2013085204 A | 5/2013 |
| JP | 2020018477 A | 2/2020 |
| JP | 2020184771 A | 11/2020 |
| JP | 2021190835 A | 12/2021 |

* cited by examiner

*Primary Examiner* — Kelly L Jerabek (74) *Attorney, Agent, or Firm* — Canon U.S.A., Inc. IP Division (57) ABSTRACT

An image capturing apparatus includes: a first heat-dissipating member to dissipate heat generated by a first heat source; at least one second heat-dissipating member to dissipate heat generated by at least one second heat source; a duct inside which the first heat-dissipating member is disposed, and configured to guide air drawn in from an inlet port toward a first outlet port; and a fan disposed between the first outlet port and the first heat-dissipating member inside the duct and configured to discharge air toward the first outlet port from the inlet port. At least one opening is positioned between the fan and first outlet port, part of the air discharged toward the first outlet port by the fan is pushed out from the opening, and the air pushed out from the opening cools the second heat-dissipating member and is discharged from a second outlet port.

10 Claims, 10 Drawing Sheets

IMAGE CAPTURING APPARATUS

BACKGROUND OF THE INVENTION

Field of the Invention

The present invention relates to an image capturing apparatus.

Description of the Related Art

Japanese Patent Laid-Open No. 2013-85204 discloses a structure in which a fan is provided at each of an inlet port and an outlet port provided in an exterior portion of an image capturing apparatus, outside air is drawn in from the inlet port, and air heated by each component inside the image capturing apparatus is discharged to the outside by the fan at the outlet port to perform overall ventilation.

Japanese Patent Laid-Open No. 2020-184771 discloses a structure in which a duct is provided between an inlet port and an outlet port provided in an exterior portion of an image capturing apparatus, outside air is drawn in by a fan provided at an inlet port of the duct, and the air inside the duct is pushed out to the outside to ventilate the inside of the duct.

SUMMARY OF THE INVENTION

An image capturing apparatus whose exterior is provided with at least one inlet port for drawing in air from outside of the image capturing apparatus and a first outlet port and a second outlet port for discharging air from inside of the image capturing apparatus includes: a first heat-dissipating member configured to dissipate heat generated by a first heat source; at least one second heat-dissipating member configured to dissipate heat generated by at least one second heat source; a duct inside which the first heat-dissipating member is disposed, and configured to guide air drawn in from the at least one inlet port toward the first outlet port; and a fan disposed between the first outlet port and the first heat-dissipating member inside the duct and configured to discharge air toward the first outlet port from the at least one inlet port. In the image capturing apparatus, at least one opening is provided in the duct, the at least one opening is positioned between the fan and the first outlet port, part of the air discharged toward the first outlet port by the fan is pushed out from the at least one opening, and the air pushed out from the at least one opening cools the at least one second heat-dissipating member and is discharged from the second outlet port.

Further features of the present invention will become apparent from the following description of exemplary embodiments with reference to the attached drawings.

DESCRIPTION OF THE EMBODIMENTS

Exemplary embodiments of the present invention are described in detail below with reference to the attached drawings. The exemplary embodiments described below are examples for realizing the present invention, should be corrected or modified as appropriate according to the structure or various conditions of an apparatus to which the present invention is applied, and the present invention is not intended to be limited to the exemplary embodiments below. Parts of the exemplary embodiments described below may be combined as appropriate.

First Exemplary Embodiment

Figure 1:
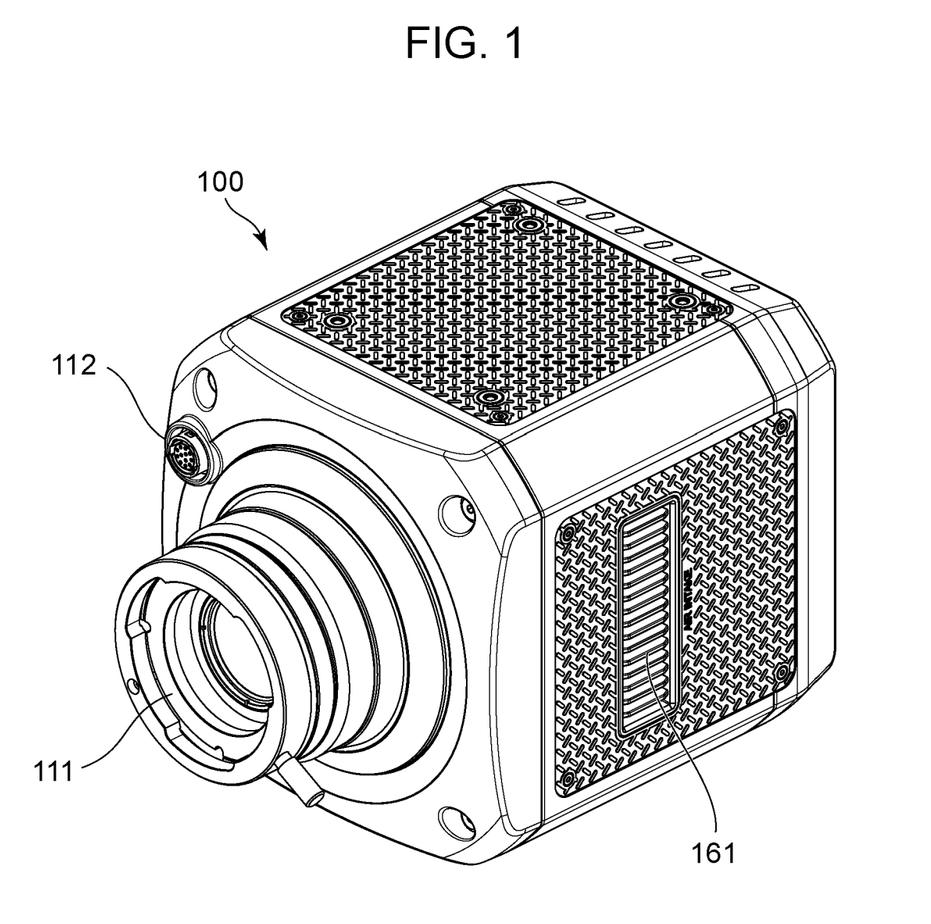
FIG. 1 is a perspective view of an image capturing apparatus according to a first exemplary embodiment.
Figure 2:
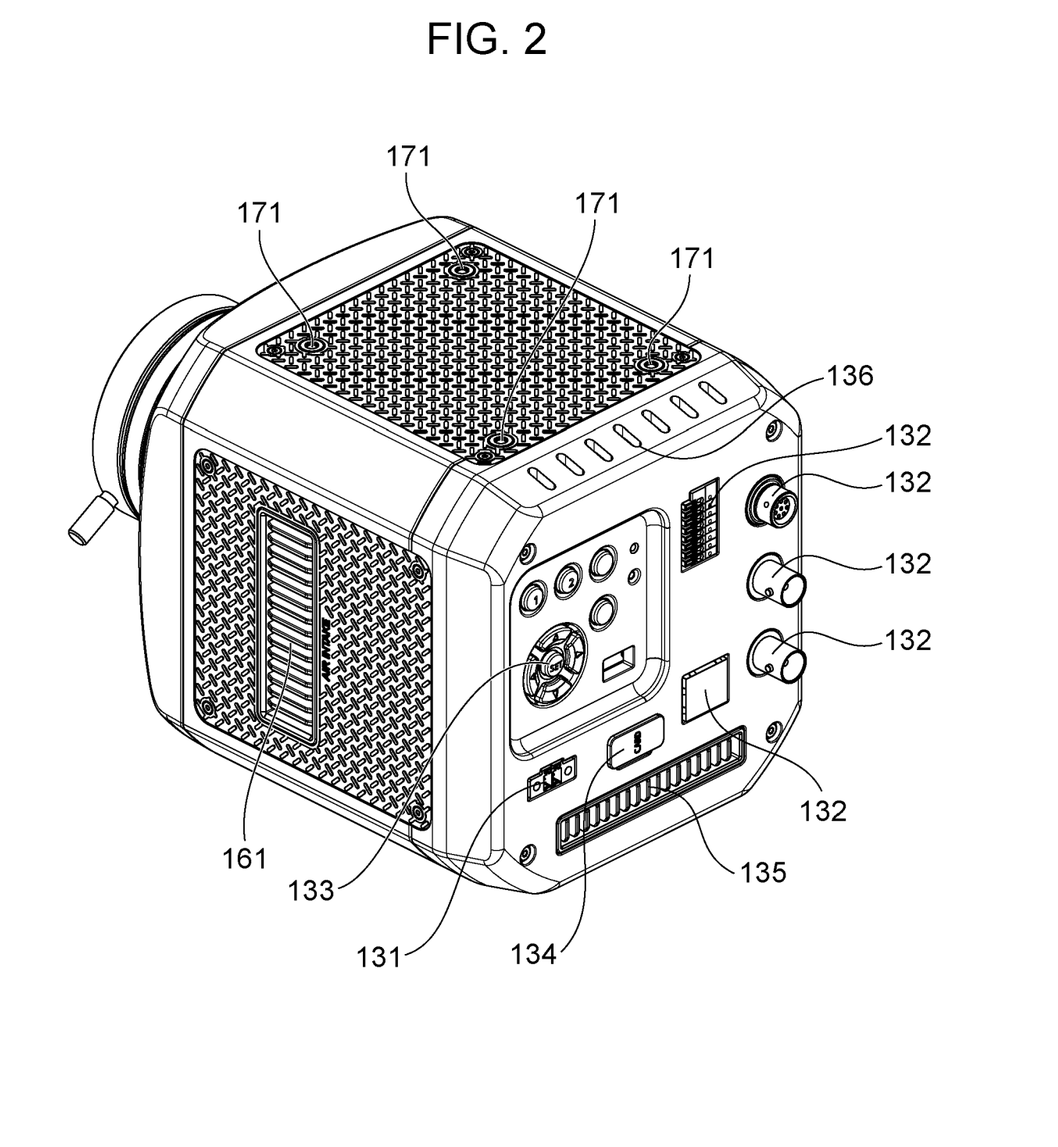
FIG. 2 is a perspective view of the image capturing apparatus according to the first exemplary embodiment.
Figure 3:
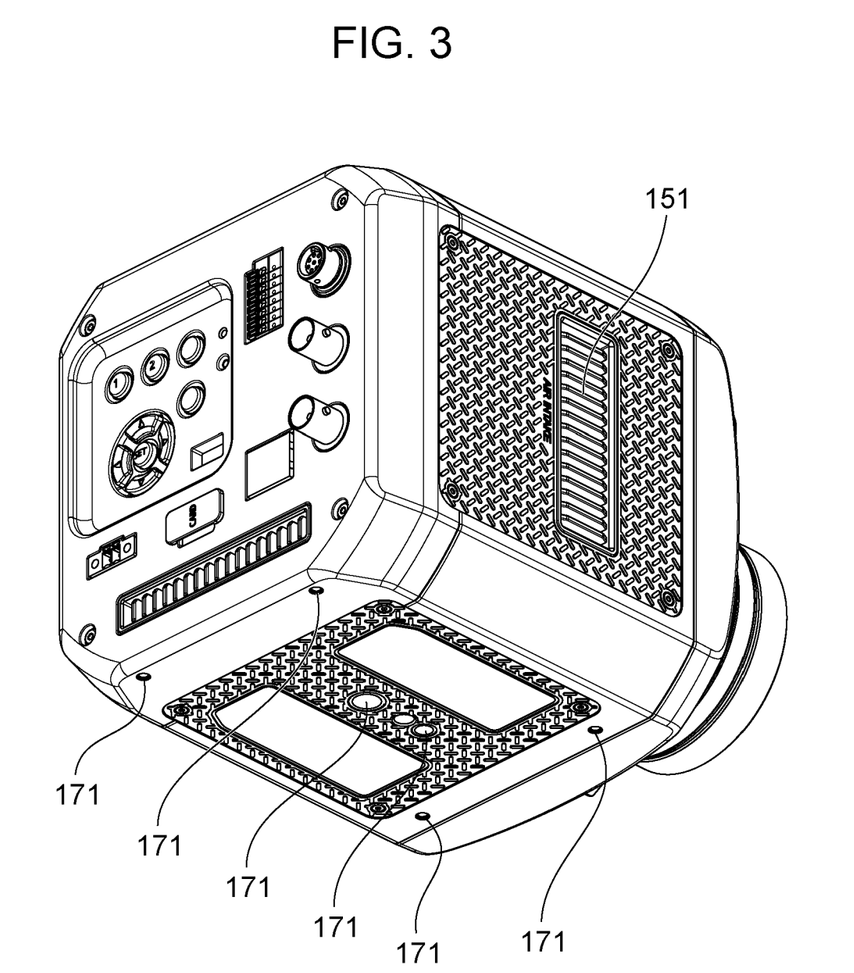
FIG. 3 is a perspective view of the image capturing apparatus according to the first exemplary embodiment.

A box-type lens-interchangeable image capturing apparatus is described below as an image capturing apparatus according to an exemplary embodiment. FIGS. 1, 2, and 3 are each a perspective view of an image capturing apparatus 100 according to the present exemplary embodiment.

The image capturing apparatus 100 has a lens mount 111, and an interchangeable lens can be attached to the lens mount 111. The lens mount 111 can be electrically connected to the interchangeable lens through a lens connector 112. Although, in the present exemplary embodiment, a bayonet mount structure is provided, a lens mount of any other form may be used. Instead of a lens-interchangeable image capturing apparatus, an integrated-lens image capturing apparatus may be used.

The image capturing apparatus 100 includes a power input terminal 131, connectors 132 for sending a signal to and receiving a signal from an external device, various keys 133 used by a user for performing operations and settings, and a slot 134 into which a memory card can be inserted. Here, although examples of the connectors 132 include SDI, Gen-Lock, and Ethernet, the connectors 132 are not limited thereto and can be variously modified and changed within the scope of the gist thereof.

An exterior of the image capturing apparatus 100 is provided with a first inlet port 151 and a second inlet port 161 for drawing in air from the outside of the image capturing apparatus 100. Although, in the present exemplary embodiment, two inlet ports are provided, it is sufficient for at least one inlet port to be provided. The exterior of the image capturing apparatus 100 is provided with a first outlet port 135 and a second outlet port 136.

Outside air is introduced into the image capturing apparatus 100 from the first inlet port 151 and the second inlet port 161, and is discharged from the first outlet port 135 to thereby make it possible to ventilate/cool the inside of the image capturing apparatus 100.

The image capturing apparatus 100 has threaded holes 171, and the image capturing apparatus 100 can be fixed to, for example, a wall, a ceiling, a pan head, or a tripod.

Figure 4:
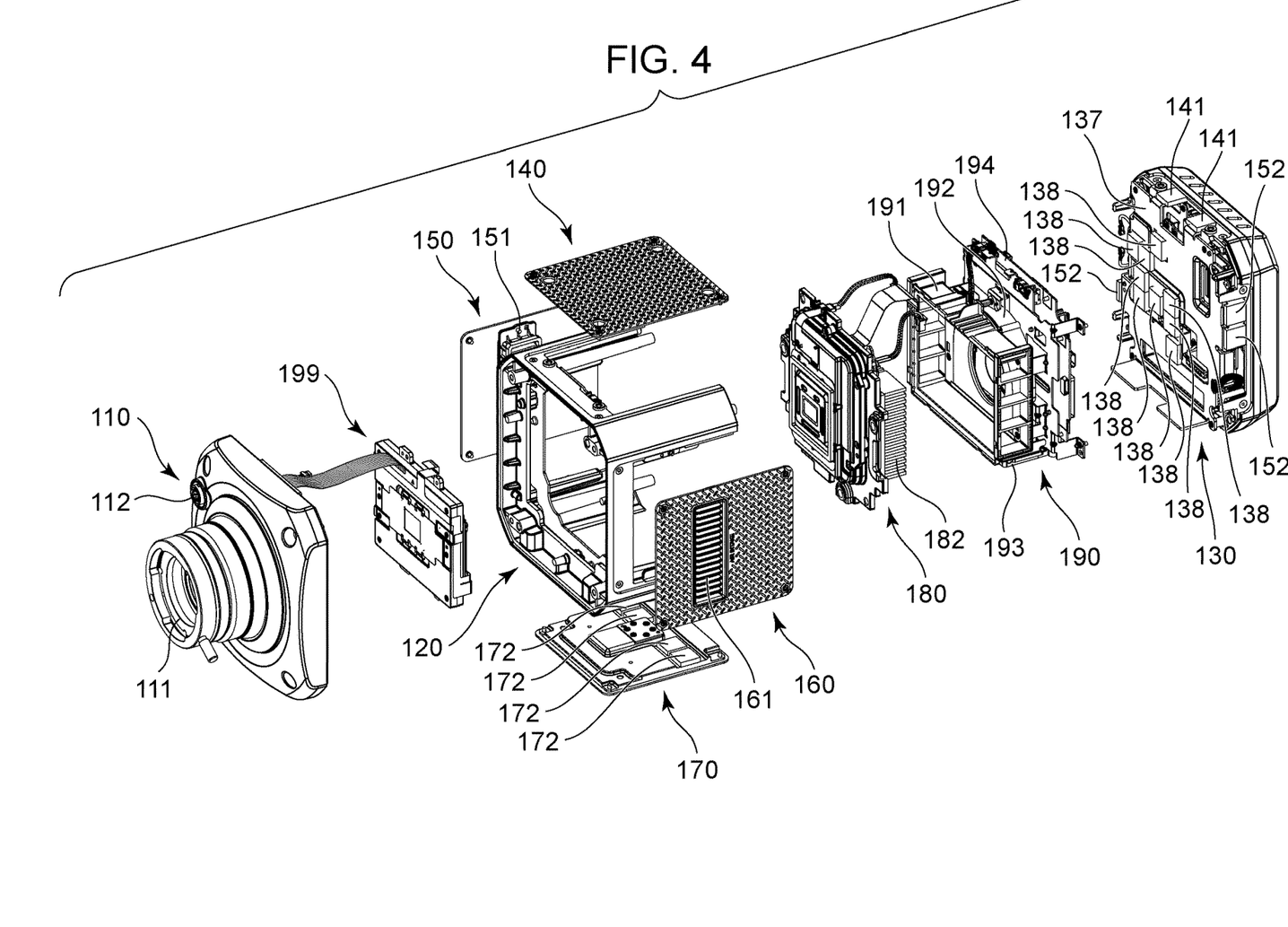
FIG. 4 is an exploded view of the image capturing apparatus according to the first exemplary embodiment.

FIG. 4 is an exploded perspective view of the image capturing apparatus 100 of the present exemplary embodiment, the image capturing apparatus 100 being divided into 10 units. A front unit 110, an intermediate unit 120, a rear unit 130, a top unit 140, a right unit 150, a left unit 160, and a bottom unit 170 constitute a housing (exterior) of the image capturing apparatus 100. A filter unit 199, a sensor unit 180, and a cooling unit 190 are provided inside the image capturing apparatus 100.

The front unit 110 constitutes a front surface of the housing of the image capturing apparatus 100, and has the lens mount 111 and the lens connector 112.

The filter unit 199 has a mechanism and an actuator that drive, for example, an ND filter or an IR cut filter, and various filters can be inserted and removed by an operation of a user.

The intermediate unit 120 constitutes an intermediate portion of the housing of the image capturing apparatus 100, and has a structure in which each unit is attached thereto.

The sensor unit 180 includes an image capturing element 181, serving as a first heat source, and a heat sink 182, serving as a first heat-dissipating member for dissipating heat generated by the image capturing element 181. The heat sink 182 is thermally connected to the first heat source, and absorbs the heat of the first heat source and dissipates the heat to air inside the image capturing apparatus 100.

The cooling unit 190 has ducts 191 and 193 and a fan 192. The ducts 191 and 193 are ducts for guiding air drawn in from the first inlet port 151 and the second inlet port toward the first outlet port 135, and the heat sink 182 is disposed inside the duct 191. The fan 192 is disposed between the heat sink 182 and the first outlet port 135 inside the ducts 191 and 193. The fan 192 is a fan for discharging air toward the first outlet port 135 from the first inlet port 151 and the second inlet port 161. The fan 192 draws in outside air from the first inlet port and the second inlet port. Since the drawn-in air flows between and in the vicinity of heat-dissipating fins of the heat sink 182, air subjected to heat dissipation by the heat sink 182 flows and is drawn in by the fan 192. The air that has been drawn in by the fan 192 (that is, the air subjected to heat dissipation by the heat sink 182) flows in the duct 193, is discharged from the first outlet port 135, and is thus discharged. In an assembled state of the image capturing apparatus 100, the heat sink 182 is contained inside the duct 191, and thus it is possible to forcefully air-cool the first heat source (the image capturing element 181). The image capturing apparatus 100 also has a data processing substrate 194 on which a heating element (for example, a data processing engine or an FPGA (not shown)), serving as a second heat source, is mounted. Although, in the present exemplary embodiment, the fan 192 draws in outside air by using a centrifugal fan, for example, an axial fan can be used depending upon the design by a designer. Therefore, a fan of any other form may be used as long as the fan can introduce outside air into the image capturing apparatus 100. Although, in the present exemplary embodiment, a second heat source is mounted on one data processing substrate, a plurality of second heat sources may be separately mounted on a plurality of substrates.

The rear unit 130 constitutes a rear surface of the housing of the image capturing apparatus 100, and has the aforementioned various connectors 132, the aforementioned various keys 133, and an interface substrate (not shown) on which the various connectors 132 and the various keys 133 are mounted. The rear unit 130 also has a heat-dissipating metal plate 137, serving as a second heat-dissipating member, and the heat-dissipating metal plate 137 is thermally connected to the heating element mounted on the data processing substrate 194 through heat-dissipating sheets 138. Examples of materials of the heat-dissipating metal plate 137 include metals having high thermal conductivity, such as an aluminum alloy and a copper alloy. The heat-dissipating metal plate 137 is a second heat-dissipating member for dissipating heat of the second heat source (the data processing substrate 194). That is, similarly to the first heat-dissipating member, the second heat-dissipating member absorbs heat generated by the second heat source and dissipates the heat to air inside the image capturing apparatus 100.

For the top unit 140, metals having high thermal conductivity, such as an aluminum alloy or a copper alloy, are used as primary materials. Since the top unit 140 and the heat-dissipating metal plate 137 are thermally connected through heat-dissipating sheets 141, heat of the data processing substrate 194 is transferred to the top unit 140 and is diffused to the outside.

The right unit 150 and the left unit 160 each have a corresponding one of the inlet port 151 and the outlet port 161, and are connected to the ducts 191 and 193. Similarly to the top unit 140, metals having high thermal conductivity, such as an aluminum alloy or a copper alloy, are used as primary materials, and it is possible to diffuse heat of the data processing substrate 194 to the outside by thermally connecting the right unit 150 and the left unit 160 to the heat-dissipating metal plate 137 through heat-dissipating sheets 152.

The bottom unit 170 has the threaded holes 171 for fixing the image capturing apparatus 100. Similarly to the top unit 140, metals having high thermal conductivity, such as an aluminum alloy or a copper alloy, are used as primary materials, and it is possible to diffuse heat of the data processing substrate 194 to the outside by thermally connecting the bottom unit 170 to the heat-dissipating metal plate 137 through heat-dissipating sheets 172.

As described above, the second heat-dissipating member (the heat-dissipating metal plate 137) is connected to at least one unit constituting the exterior (the housing) of the image capturing apparatus 100 so as to transfer heat of the second heat-dissipating member to the at least one unit. This makes it possible to cool the second heat source (the data processing substrate 194). This is realized in combination with a cooling method described below.

Figure 5:
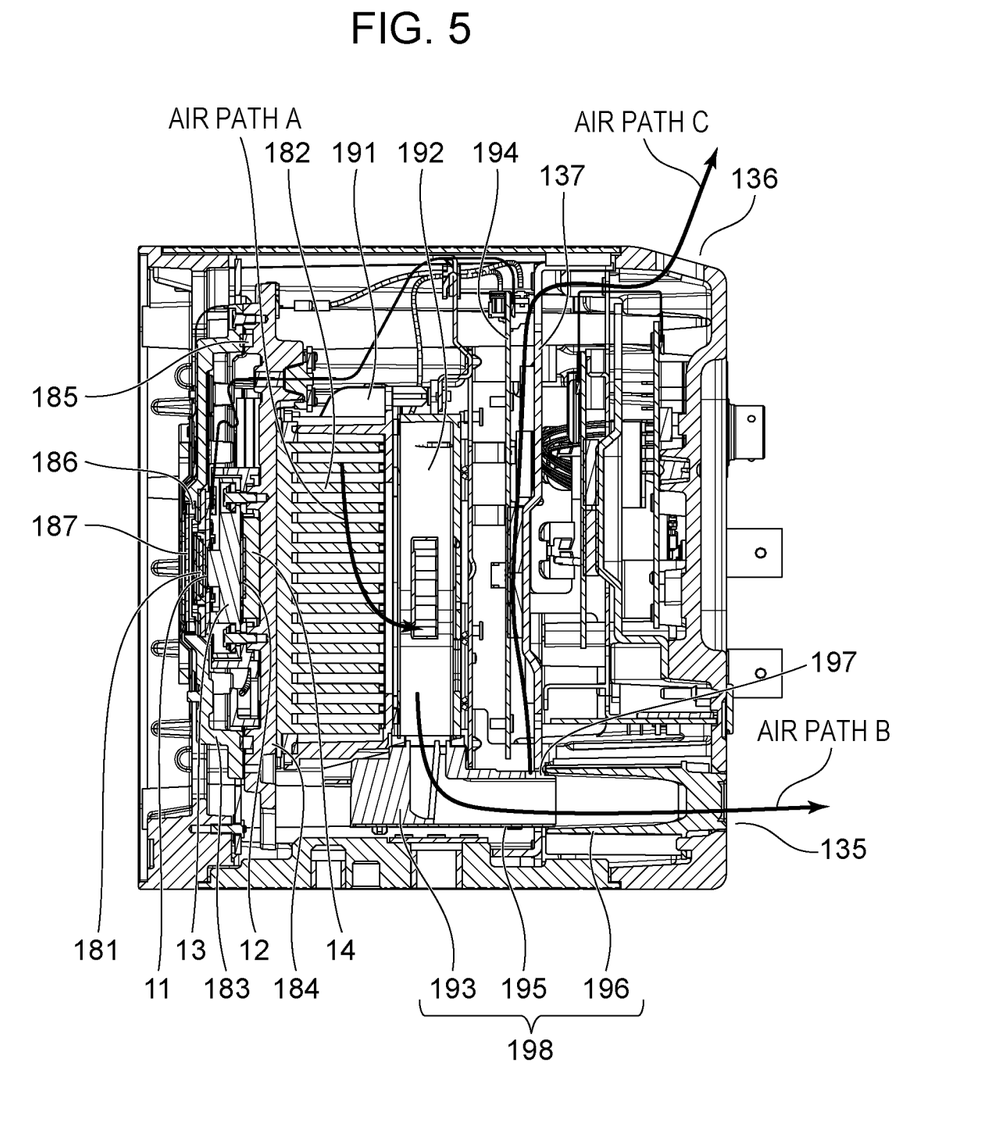
FIG. 5 is a sectional view of the image capturing apparatus according to the first exemplary embodiment.

FIG. 5 is a sectional view of the image capturing apparatus 100 after removal of the front unit 110 and the filter unit 199. Detailed structures of the sensor unit 180 and the cooling unit 190 and a cooling structure of the image capturing apparatus 100 are described below with reference to FIG. 5. Outer surfaces of the sensor unit 180 are constituted by a front sensor case 183 and a rear sensor case 184, and the image capturing element 181 is disposed inside the sensor unit 180. The image capturing element 181 is thermally connected to a heat-absorption surface of a Peltier element 14 through a heat conduction member 11, a metal block 13, and a heat conduction member 12. The so-called heat conduction members 11 and 12 may be, for example, heat-dissipating sheets or heat-dissipating grease. The metal block 13 is desirably made of a material having high thermal conductivity, such as an aluminum alloy or a copper alloy. A heat-dissipating surface of the Peltier element 14 is thermally connected to the heat sink 182 through a heat conduction member (for example, a heat-dissipating sheet or heat-dissipating grease) and a rear sensor case 184. It is possible to cool the image capturing element 181 by dissipating heat of the heat sink 182 to air inside the image capturing apparatus 100. Here, the rear sensor case 184 is also desirably made of a material having high thermal conductivity, such as an aluminum alloy or a copper alloy.

A case sealing member 185 is provided between the front sensor case 183 and the rear sensor case 184, and prevents entry of water vapor into the sensor unit 180 and condensation in the image capturing element 181. The front sensor case 183 has an open window provided in accordance with the position of an image capturing surface of the image capturing element 181, and a cover glass 187 is attached to the front sensor case 183 through a glass sealing member 186. Although, in the present exemplary embodiment, the image capturing element 181 is cooled through the Peltier element 14, the image capturing element 181 may be directly connected to the heat sink 182 without using a Peltier element.

An air path A (a first air path) is formed such that outside air is drawn in through the duct 191 from the inlet port 151 and the inlet port 161 when the fan 192 attached to the cooling unit 190 is driven. The air path A is a path through which a current of air for guiding air drawn in from the inlet port 151 and the inlet port 161 up to the fan 192 passes, and is formed by the duct 191. At this time, since the heat sink 182 is contained in the duct 191 (the first heat-dissipating member is disposed at the air path A), it is possible to cool the heat-dissipation surface of the Peltier element 14 and the image capturing element 181. A duct 198 and an air path B (a second air path) are formed by the duct 193, a duct cover 195, and a duct 196. The air path B is a path through which a current of air for guiding air discharged from the fan 192 up to the first outlet port 135 passes. The air discharged from the fan 192 passes through the air path B and is discharged to the outside of the image capturing apparatus 100 from the first outlet port 135. That is, the air paths A and B are paths through which air passes and are formed by the duct 198, and the inlet port 151 and the inlet port 161 are at a most upstream side of the duct 198 and the first outlet port is at a most downstream side of the duct 198.

Figure 6:
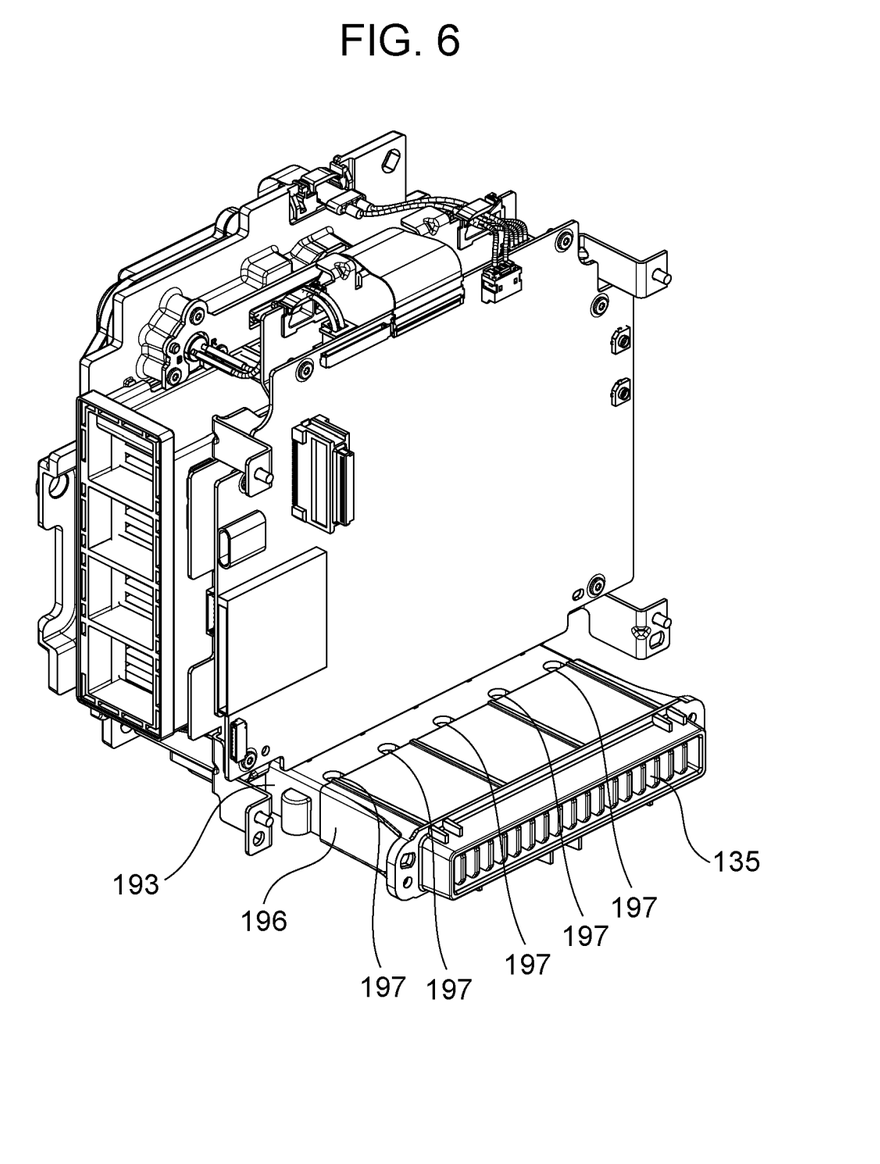
FIG. 6 is a perspective view of a cooling mechanism of the image capturing apparatus according to the first exemplary embodiment.

FIG. 6 is a perspective view of the image capturing apparatus 100 after taking out only the cooling unit 190 and the duct 196. Details of a cooling mechanism of the data processing substrate 194 is described with reference to FIGS. 5 and 6.

As shown in FIG. 6, the duct 193 has a plurality of openings 197. The openings 197 are positioned between the fan 192 and the second outlet port. Although, in the present exemplary embodiment, a plurality of openings are provided, one opening in which a plurality of holes are connected to each other may be provided. That is, it is sufficient to provide at least one opening in the duct 193. By providing a structure such as that described above, part of air discharged toward the first outlet port from the fan 192, that is, part of air discharged by passing through the duct 198 (air flowing through the air path B) is pushed out from the openings 197.

Figure 7:
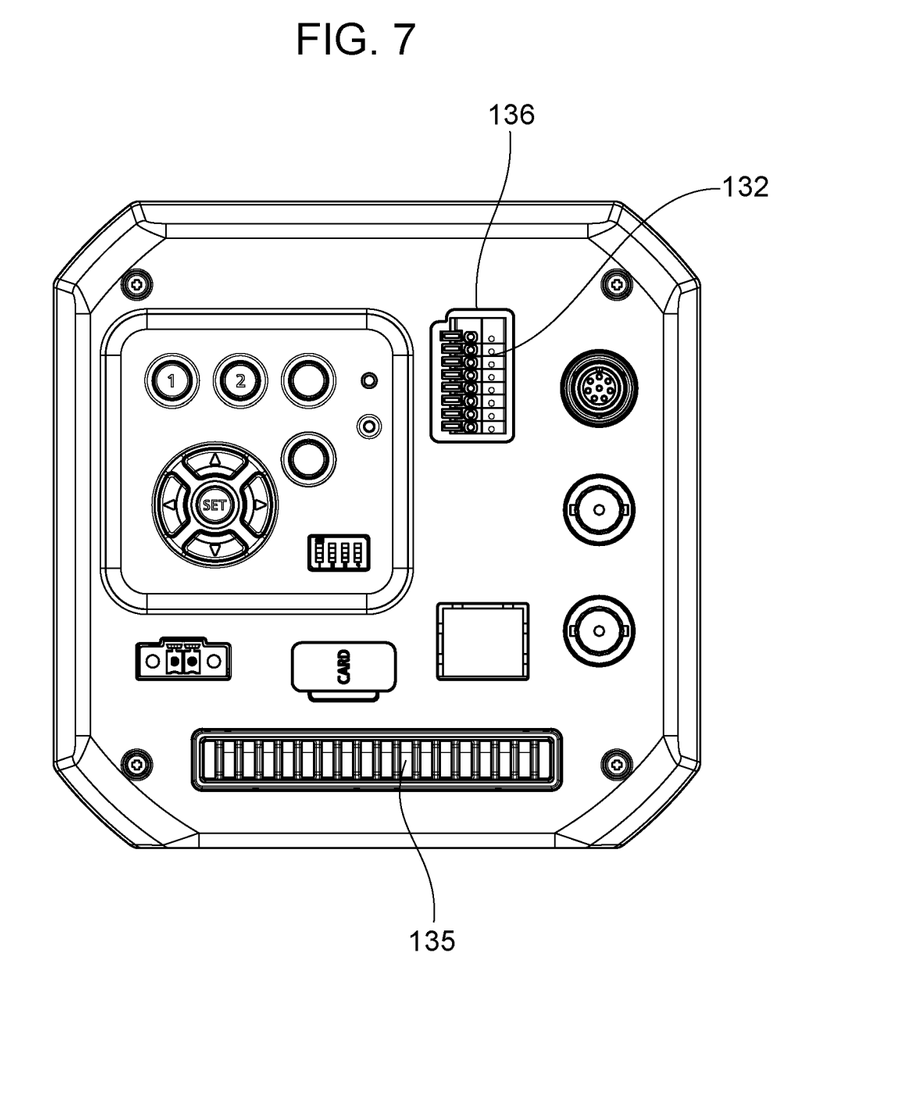
FIG. 7 is a rear view of the image capturing apparatus according to the first exemplary embodiment.

As shown in FIG. 5, an air path C (a third air path) is formed such that the air pushed out from the openings 197 circulates inside the image capturing apparatus 100, and is discharged to the outside of the image capturing apparatus 100 from the second outlet port 136. The air path C is not formed by a duct as with the air path A and the air path B. Specifically, the air path C is formed by at least one unit constituting the exterior of the image capturing apparatus 100, such as the rear unit 130 or the top unit 140. This is to cool a heat source (such as a power supply circuit substrate) other than the data processing substrate 194 by ventilation inside the image capturing apparatus 100. In other words, in order to cool a plurality of heat-dissipating members for dissipating heat of a plurality of second heat sources, the plurality of second heat-dissipating members are disposed at the air path C. It is sufficient for at least one second heat-dissipating member for dissipating heat of at least one second heat source to be disposed at the air path C. The openings 197 are at a most upstream side of the air path C, and the second outlet port is at a most downstream side of the air path C. Here, by disposing the second heat-dissipating member (the heat-dissipating metal plate 137) between the openings 197 and the second outlet port 136 (disposing the second heat-dissipating member at the air path C), air passing through the air path C is supplied to the heat-dissipating metal plate 137. Therefore, the air that is pushed out from the openings 197 cools the heat-dissipating metal plate 137 and is discharged from the second outlet port. As described above, if a plurality of second heat-dissipating members are disposed, these can also be cooled. Although, in the present exemplary embodiment, the second outlet port 136 opens in the rear surface of the housing of the image capturing apparatus 100, for example, as shown in FIG. 7, a widened clearance of the connectors 132 and the housing may be the second outlet port 136. That is, the second outlet port may be smaller than the first outlet port.

Here, the temperature of air at an inlet of the air path A, that is, the temperature of air that has been drawn in from the first inlet port 151 and the second inlet port 161 is substantially the same as the temperature of the environment in which the image capturing apparatus 100 is installed. The temperature of air in the air path B increases by heat dissipated from the heat sink 182. As described above, part of the air in the air path B is pushed out from the openings 197 and flows to the air path C, and the remaining air pushed out from the openings 197 is discharged from the first outlet port 135.

In other words, part of air heated by the heat sink 182 flows to the air path C. Since the second heat-dissipating member is disposed at the air path C, in order to cool the second heat-dissipating member (the heat-dissipating metal plate 137), it is sufficient that the condition of (temperature of air in the air path B)<(temperature of the heat-dissipating metal plate 137) be satisfied. As long as the condition above is satisfied, the data processing substrate 194 is cooled by the air pushed out to the air path C. Therefore, it is desirable that the temperatures of the respective portions in the cooling unit 190 have the following relationship:

(environment temperature)<(temperature of air in the air path $B$)<(temperature of the heat-dissipating metal plate 137)

In general, as the temperature of the image capturing element 181 decreases, the performance of the image capturing element 181 is improved, whereas the heat value itself of the image capturing element is lower than that of, for example, a data processing engine. Therefore, if an image capturing apparatus has a structure such as that of the present exemplary embodiment, the fan 192 is driven so as to reduce the temperature of the heat sink 182 to a temperature near the environment temperature and thus causes the temperature of air that flows in the air path B or the temperature of air at the inlet of the air path C to be a temperature near the environment temperature. On the other hand, elements such as a data processing engine and an FPGA, have heat values larger than those of, for example, image capturing elements, whereas the operations of such elements can often be guaranteed even if their temperatures are rather high. Therefore, if an image capturing apparatus has a structure such as that of the present exemplary embodiment, in general, the temperature of the heat-dissipating metal plate 137 is increased, and the relationship of (temperature of air in the air path B)<(temperature of the heat-dissipating metal plate 137) mentioned above is established.

Figure 8:
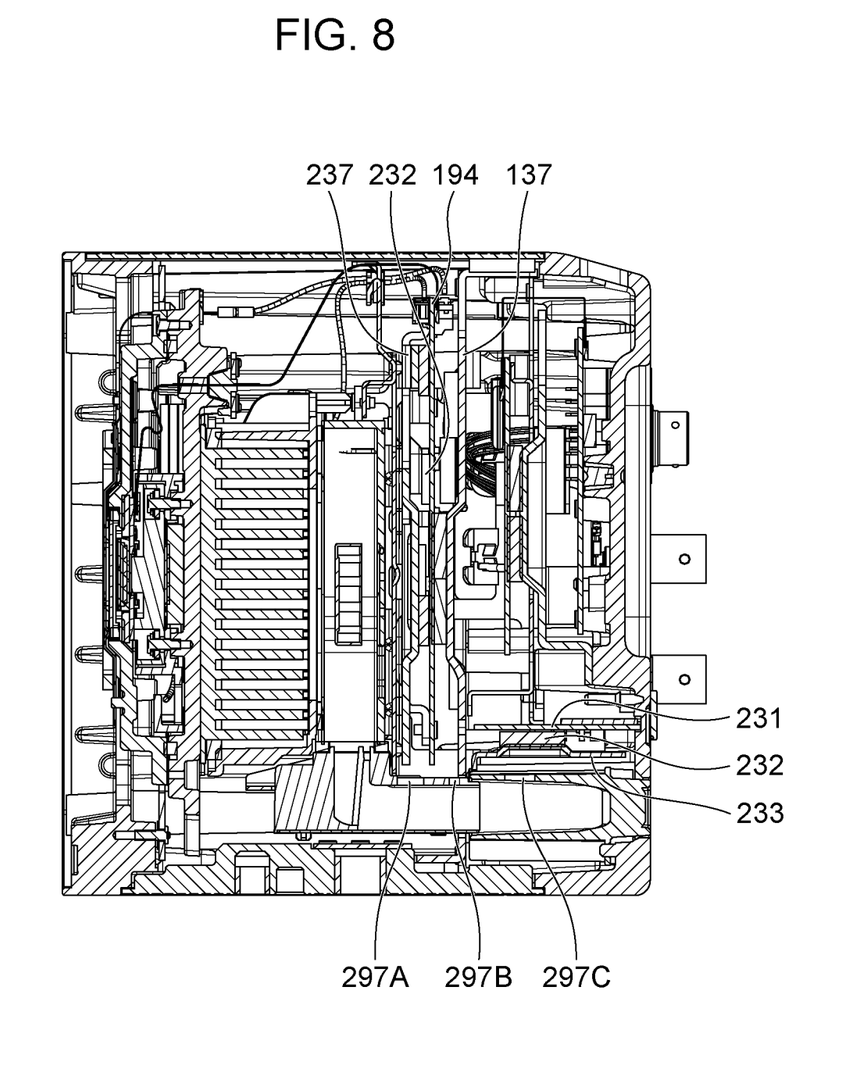
FIG. 8 is a sectional view of the image capturing apparatus according to the first exemplary embodiment.

When the structure of the image capturing apparatus 100 according to the present exemplary embodiment is used, even if a plurality of heat sources are mounted so as to be scattered on the data processing substrate 194, the heat sources can be cooled by air flow in the air path C without changing the shape of the duct 198 and ventilation resistance. As shown in FIG. 8, a plurality of heat-dissipating metal plates or a plurality of heating elements, serving as second heat sources, may be scattered on a plurality of substrates. The heat source of the data processing substrate 194 is such that heat is diffused to, in addition to the heat-dissipating metal plate 137, a second heat-dissipating metal plate 237 through a heat-dissipating sheet 232. A heat source (not shown) on a power supply circuit substrate 231 is such that heat is diffused to a third heat-dissipating metal plate 233 through a heat-dissipating sheet 232. Even in these cases, by providing openings 297A, 297B, and 297C in accordance with the heat-dissipating metal plates 237, 137, and 233, it becomes possible to efficiently cool a plurality of heat sources and to improve the cooling performance inside the image capturing apparatus 100.

The duct 193 is disposed below the second heat source (the data processing substrate 194), and the openings 197 are provided in an upper surface of the duct 193. Therefore, when dirt of outside air, such as dust, is drawn in by the fan 192, the dirt does not flow to, for example, the data processing substrate 194 and falls due to gravitation. The dirt passes through the air path B and is discharged to the outside of the image capturing apparatus 100 from the first outlet port 135.

Second Exemplary Embodiment

Figure 9:
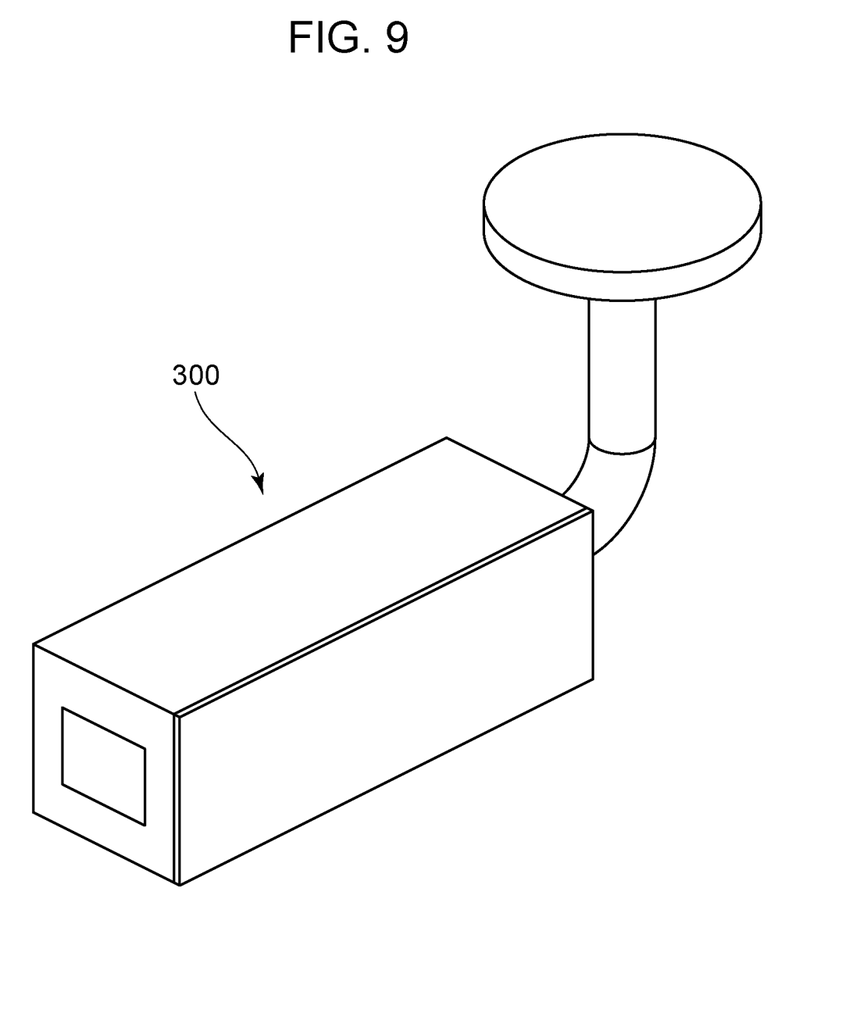
FIG. 9 is a perspective view of an image capturing apparatus according to a second exemplary embodiment.
Figure 10:
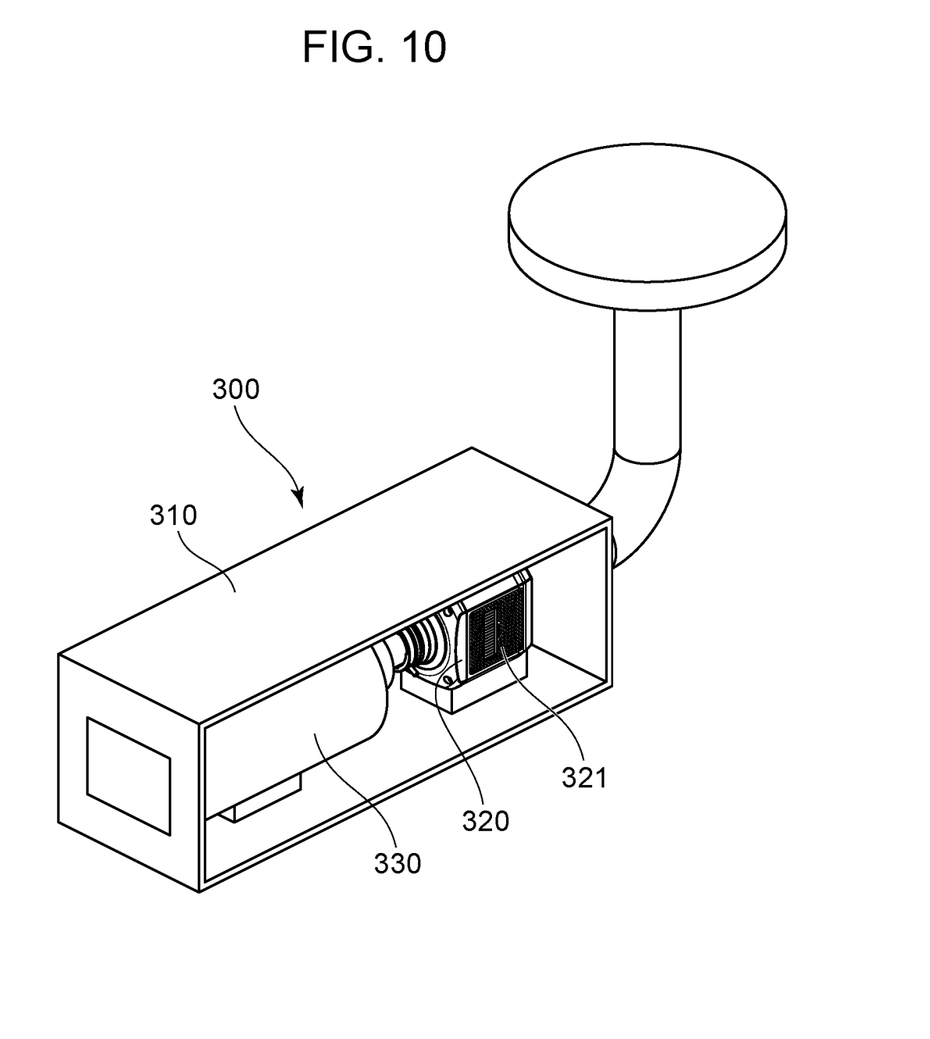
FIG. 10 is an exploded view of the image capturing apparatus according to the second exemplary embodiment.

An outdoor installation-type image capturing apparatus according to an exemplary embodiment is described below. FIG. 9 is a perspective view of an image capturing apparatus 300 according to the present exemplary embodiment, and FIG. 10 shows an internal structure of the image capturing apparatus 300.

The image capturing apparatus 300 includes a housing 310, and a camera device 320 and a lens 330 that are contained in the housing 310. Here, the housing 310, the camera device 320, and the lens 330 may each be removably provided or may be integrated with each other.

Here, the camera device 320 has a structure that is the same as the structure of the image capturing apparatus 100 described in the first exemplary embodiment. By driving a fan (not shown) inside the camera device 320, air is drawn in from an inlet port 321 and is discharged from a first outlet port 135 and a second outlet port 136.

The housing 310 is hermetically sealed and causes the camera device 320 and the lens 330 to be waterproof. Therefore, the fan of the camera device 320 causes air inside the housing 310 to circulate. Even in this case, similarly to the image capturing apparatus 100 described in the first exemplary embodiment, it is possible to efficiently cool heat sources, such as an image capturing element and a data processing engine.

Although exemplary embodiments of the present invention have been described above, the present invention is not limited to these exemplary embodiment, and various modifications and changes are possible with the scope of the spirit of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-102256, filed Jun. 24, 2022, which is hereby incorporated by reference herein in its entirety.

What is claimed is:

1. An image capturing apparatus whose exterior is provided with at least one inlet port for drawing in air from outside of the image capturing apparatus and a first outlet port and a second outlet port for discharging air from inside of the image capturing apparatus, the image capturing apparatus comprising:
    a first heat-dissipating member configured to dissipate heat generated by a first heat source;
    at least one second heat-dissipating member configured to dissipate heat generated by at least one second heat source;
    a duct inside which the first heat-dissipating member is disposed, and configured to guide air drawn in from the at least one inlet port toward the first outlet port; and
    a fan disposed between the first outlet port and the first heat-dissipating member inside the duct and configured to discharge air toward the first outlet port from the at least one inlet port,
    wherein at least one opening is provided in the duct,
    wherein the at least one opening is positioned between the fan and the first outlet port,
    wherein part of the air discharged toward the first outlet port by the fan is pushed out from the at least one opening,
    wherein the air pushed out from the at least one opening cools the at least one second heat-dissipating member and is discharged from the second outlet port, and
    wherein at least one unit constituting the exterior of the image capturing apparatus forms a third air path for guiding the air pushed out from the at least one opening to the second outlet port, and the at least one second heat-dissipating member is disposed at the third air path.

2. The image capturing apparatus according to claim 1, wherein the first heat source is an image capturing element, and the at least one second heat source is a data processing substrate.

3. The image capturing apparatus according to claim 1, wherein the first heat-dissipating member is a heat sink, and the at least one second heat-dissipating member is a heat-dissipating metal plate.

4. The image capturing apparatus according to claim 1, wherein the duct is disposed below the at least one second heat source, and the at least one opening is provided such that the air pushed out from the at least one opening flows to a position of the at least one second heat-dissipating member.

5. The image capturing apparatus according to claim 1, wherein the at least one second heat-dissipating member is connected to at least one unit constituting the exterior of the image capturing apparatus so as to transfer heat to the at least one unit.

6. The image capturing apparatus according to claim 1, wherein the duct forms a first air path for guiding the air drawn in from the at least one inlet port up to the fan, and the at least one second heat-dissipating member is disposed at the first air path.

7. The image capturing apparatus according to claim 1, wherein the duct forms a second air path for guiding the air discharged from the fan up to the first outlet port, and the at least one opening is provided in the duct such that part of air that flows in the second air path is pushed out from the at least one opening.

8. The image capturing apparatus according to claim 1, wherein a temperature of the at least one second heat-dissipating member is higher than a temperature of air that flows in a second air path.

9. The image capturing apparatus according to claim 1, wherein the second outlet port is smaller than the first outlet port.

10. The image capturing apparatus according to claim 1, wherein the second outlet port is provided at a connector configured to allow the image capturing apparatus to send a signal to and receive a signal from an external device.

* * * * *